US012609154B2

(12) United States Patent (10) Patent No.: US 12,609,154 B2
Guo et al. (45) Date of Patent: Apr. 21, 2026

(54) DATA BUFFER CIRCUIT STRUCTURE, LAYOUT STRUCTURE OF MULTIPLE DATA BUFFER CIRCUITS, AND MEMORY

(71) Applicant: CXMT CORPORATION, Hefei (CN)

(72) Inventors: Yingdong Guo, Hefei (CN); Wei Jiang, Hefei (CN); Jing Xu, Hefei (CN); Yuxia Wang, Hefei (CN); Cheng Chen, Hefei (CN)

(73) Assignee: CXMT CORPORATION, Hefei (CN)

( * ) Notice: Subject to any disclaimer, the term of this patent is extended or adjusted under 35 U.S.C. 154(b) by 102 days.

(21) Appl. No.: 18/820,305

(22) Filed: Aug. 30, 2024

(65) Prior Publication Data

US 2024/0428849 A1      Dec. 26, 2024

Related U.S. Application Data

(63) Continuation of application No. PCT/CN2023/070526, filed on Jan. 4, 2023.

(30) Foreign Application Priority Data

Nov. 1, 2022      (CN) .......................... 202211358049.5

(51) Int. Cl.
*G11C 11/4093* (2006.01)
*H10B 12/00* (2023.01)
(52) U.S. Cl.
CPC .......... *G11C 11/4093* (2013.01); *H10B 12/50* (2023.02)

(58) Field of Classification Search
CPC ................................................... G11C 11/4093
See application file for complete search history.

(56) References Cited

U.S. PATENT DOCUMENTS

2002/0180483 A1*  12/2002  Lim .................. H03K 19/00323
                                                                326/83
2005/0046449 A1*   3/2005  Davis ............... H03K 19/00315
                                                                327/333
2019/0208151 A1*   7/2019  Taura ...................... H04N 25/78

* cited by examiner

*Primary Examiner* — Douglas King
(74) *Attorney, Agent, or Firm* — Kilpatrick Townsend & Stockton LLP

(57) ABSTRACT

A data buffer circuit structure, a layout structure of multiple data buffer circuits, and a memory. The data buffer circuit structure includes a first amplification circuit, a second amplification circuit, a decision equalizer, and a power module. An output terminal of the first amplification circuit, an input terminal of the second amplification circuit, and adjustment output terminals of the decision equalizer are connected through a signal line. The power module includes a first power supply unit and a second power supply unit. A minimum distance between the first power supply unit and the first amplification circuit is less than a minimum distance between the first power supply unit and the second amplification circuit, and a minimum distance between the second power supply unit and the second amplification circuit is less than a minimum distance between the second power supply unit and the first amplification circuit.

17 Claims, 7 Drawing Sheets

201

First power
supply unit

N201

101

P101          P102

N101          N102

DATA BUFFER CIRCUIT STRUCTURE, LAYOUT STRUCTURE OF MULTIPLE DATA BUFFER CIRCUITS, AND MEMORY

CROSS-REFERENCE TO RELATED APPLICATIONS

The present disclosure is a US continuation application of International Application No. PCT/CN2023/070526, filed on Jan. 4, 2023, which is based on and claims the priority to Chinese Patent Application No. 202211358049.5, filed on Nov. 1, 2022 and entitled "DATA BUFFER CIRCUIT STRUCTURE, LAYOUT STRUCTURE OF MULTIPLE DATA BUFFER CIRCUITS, AND MEMORY". The disclosures of the above applications are hereby incorporated by reference in their entirety.

TECHNICAL FIELD

The present disclosure relates to the field of semiconductor structures and layout design, and in particular, to a data buffer circuit structure, a layout structure of multiple data buffer circuits, and a memory.

BACKGROUND

In the layout design of a dynamic random access memory (DRAM), a data buffer circuit (Data Interbuffer) is a channel for data input and data output, and is an important interface for receiving external data and reading internal data.

In the circuit of double data rate 5 (DDR5)/low power double data rate (LPDDR5), the data buffer circuit includes a first amplification circuit, a second amplification circuit, and a decision feedback equalization (DFE) module for adjusting an input signal of the second amplification circuit. DFE is a method for providing a better equalization effect through feedback from a memory bus receiver to reduce inter-symbol interference. The better equalization effect can further enable a memory bus in DDR5/LPDDR5 to transmit required clearer signal transmission at a higher transmission rate without faults in addition to opening an eye pattern of data after the data is latched by the receiver.

Based on module division, elements of the same module are usually disposed together, causing a connection line between a decision equalizer and a power supply to be excessively long, thereby affecting the performance of the data buffer circuit. How to optimize a layout structure of the data buffer circuit is a key factor for optimizing the performance of the data buffer circuit.

SUMMARY

An embodiment of the present disclosure provides a data buffer circuit structure, including a first amplification circuit, a second amplification circuit, a decision equalizer, and a power module. An output terminal of the first amplification circuit, an input terminal of the second amplification circuit, and adjustment output terminals of the decision equalizer are connected through a signal line, and the first amplification circuit, the second amplification circuit, the decision equalizer, and the power module are arranged in the same direction. The power module includes a first power supply unit and a second power supply unit. The first power supply unit is configured to supply power to the first amplification circuit and the decision equalizer, and the second power supply unit is configured to supply power to the second amplification circuit. A minimum distance between the first power supply unit and the first amplification circuit is less than a minimum distance between the first power supply unit and the second amplification circuit, and a minimum distance between the second power supply unit and the second amplification circuit is less than a minimum distance between the second power supply unit and the first amplification circuit.

Another embodiment of the present disclosure further provides a layout structure of multiple data buffer circuits, including multiple adjacent data buffer circuits. Each of the data buffer circuits is disposed based on the data buffer circuit structure provided in the foregoing embodiment.

Still another embodiment of the present disclosure further provides a memory. A data buffer circuit in the memory is disposed based on the data buffer circuit structure provided in the foregoing embodiment.

BRIEF DESCRIPTION OF DRAWINGS

One or more embodiments are exemplified with the figures in the accompanying drawings corresponding to the one or more embodiments. These example descriptions are not intended to limit the embodiments, and unless specifically stated otherwise, the figures in the accompanying drawings are not to scale. To describe the technical solutions in the embodiments of the present disclosure or the conventional technologies more clearly, the following briefly describes the accompanying drawings required for describing the embodiments. Clearly, the accompanying drawings in the following description show merely some embodiments of the present disclosure, and a person of ordinary skill in the art may still derive other drawings from these accompanying drawings without creative efforts.

DESCRIPTION OF EMBODIMENTS

It can be learned from the BACKGROUND that based on module division, elements of the same module are usually disposed together, causing some decision feedback equalization module connection lines and/or power connection lines to be excessively long, thereby affecting the performance of a data buffer circuit. How to optimize a layout structure of the data buffer circuit is a key factor for optimizing the performance of the data buffer circuit.

An embodiment of the present disclosure provides a data buffer circuit structure, to reduce a connection line length of the power module, thereby optimizing the performance of a data buffer circuit.

A person of ordinary skill in the art may understand that in the embodiments of the present disclosure, many technical details are provided to enable readers to better understand the present disclosure. However, the technical solutions claimed in the present disclosure may be implemented even without these technical details and various variations and modifications made based on the following embodiments. The division of the following embodiments is for ease of description, and should not constitute any limitation on a specific implementation of the present disclosure. The embodiments may be mutually combined and mutually referenced when there is no contradiction.

Figure 1:
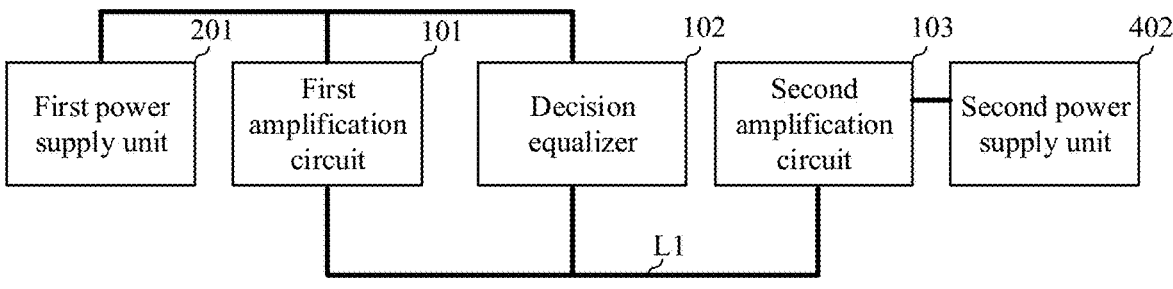
FIG. 1 is a schematic diagram of a structure of a data buffer circuit structure according to an embodiment of the present disclosure.
Figure 2:
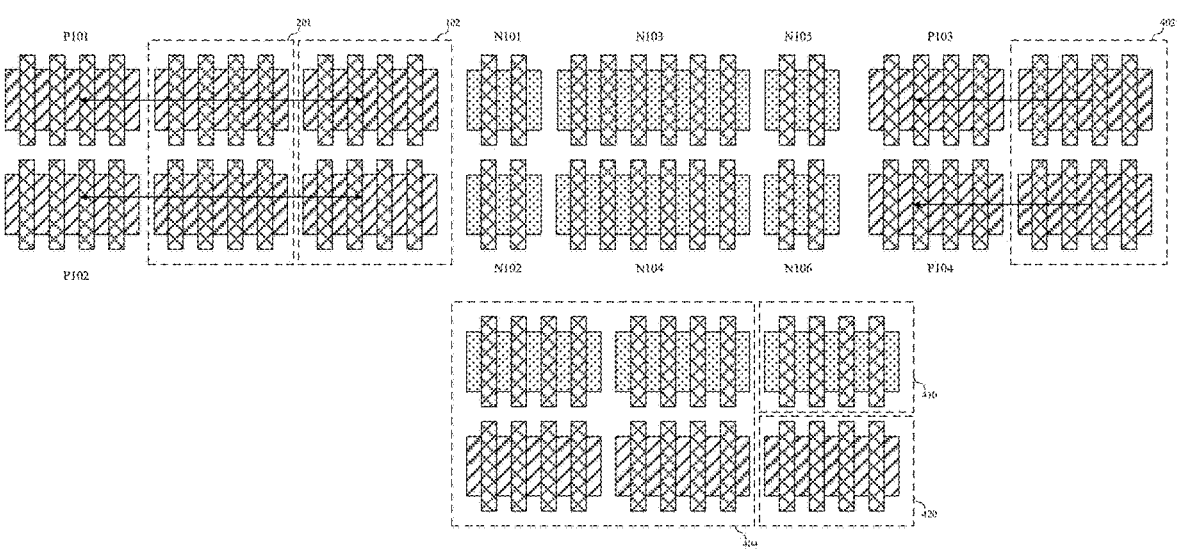
FIG. 2 to FIG. 4 are schematic diagrams of a layout structure of a data buffer circuit structure according to an embodiment of the present disclosure.
Figure 3:
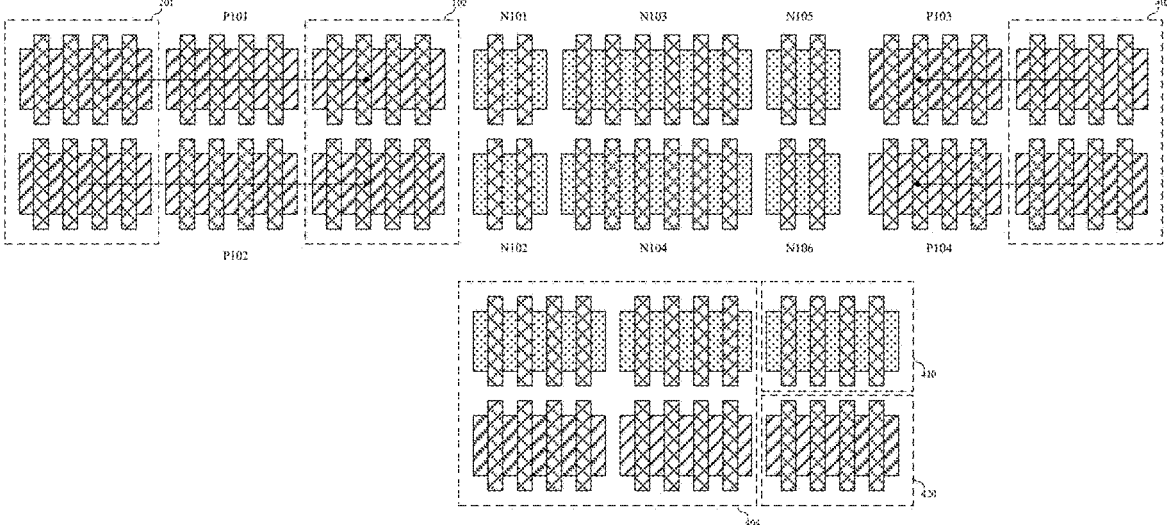
Figures 4, 5:
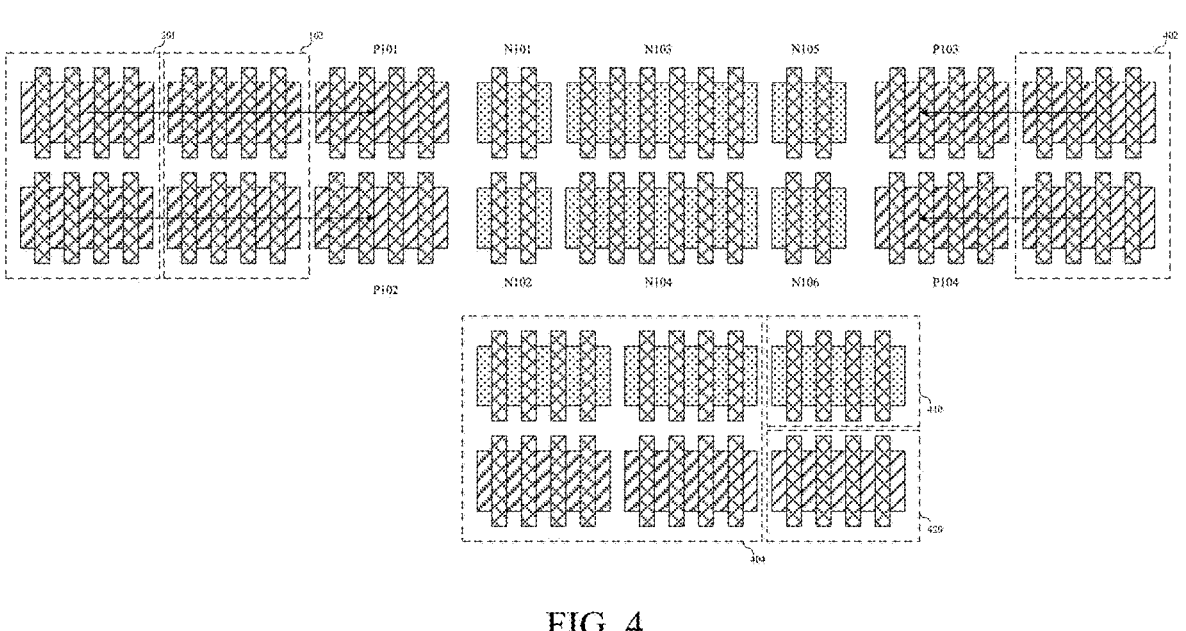
FIG. 5 is a schematic diagram of a structure of a first amplification circuit according to an embodiment of the present disclosure.
Figure 6:
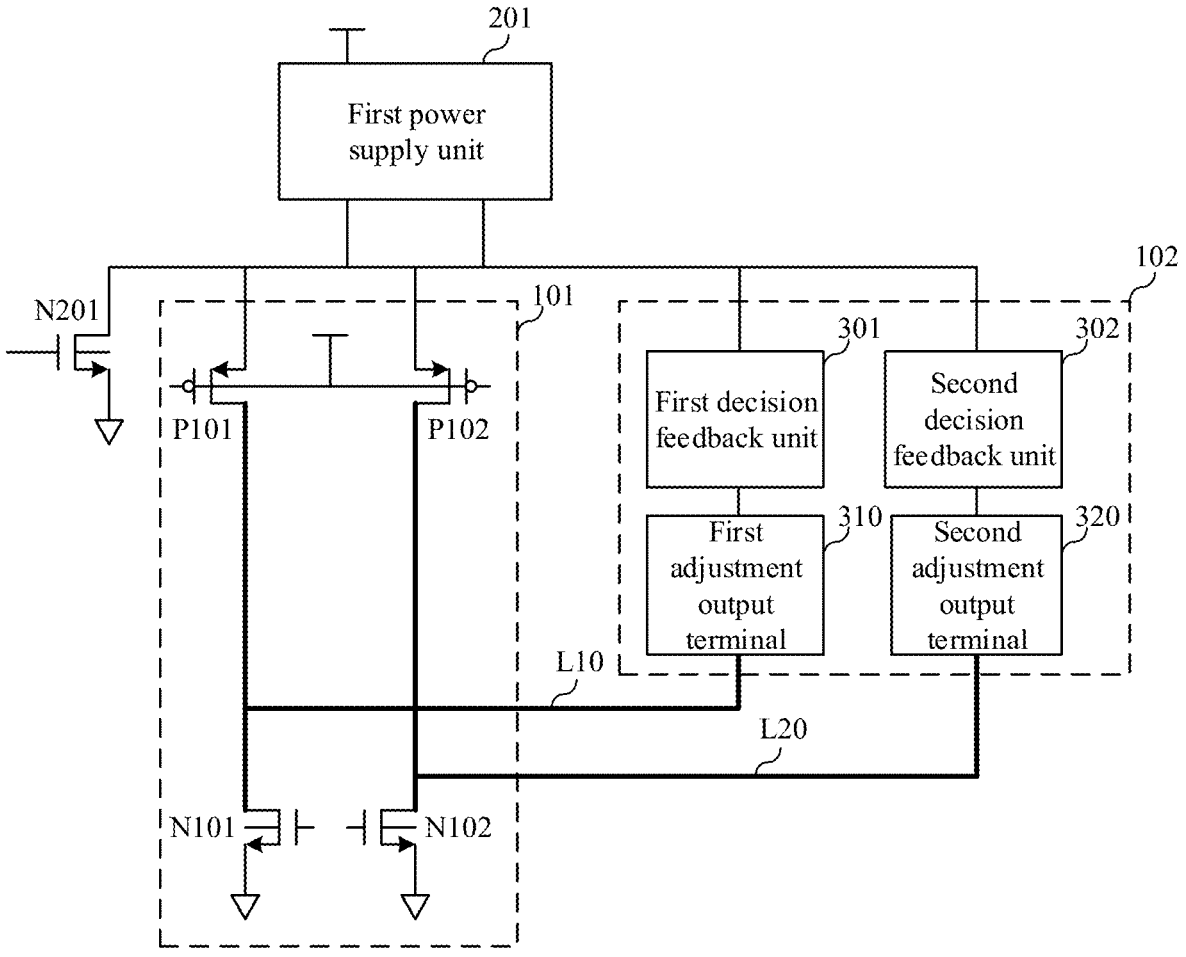
FIG. 6 is a schematic diagram of structures of a first amplification circuit and a decision equalizer according to an embodiment of the present disclosure.
Figure 7:
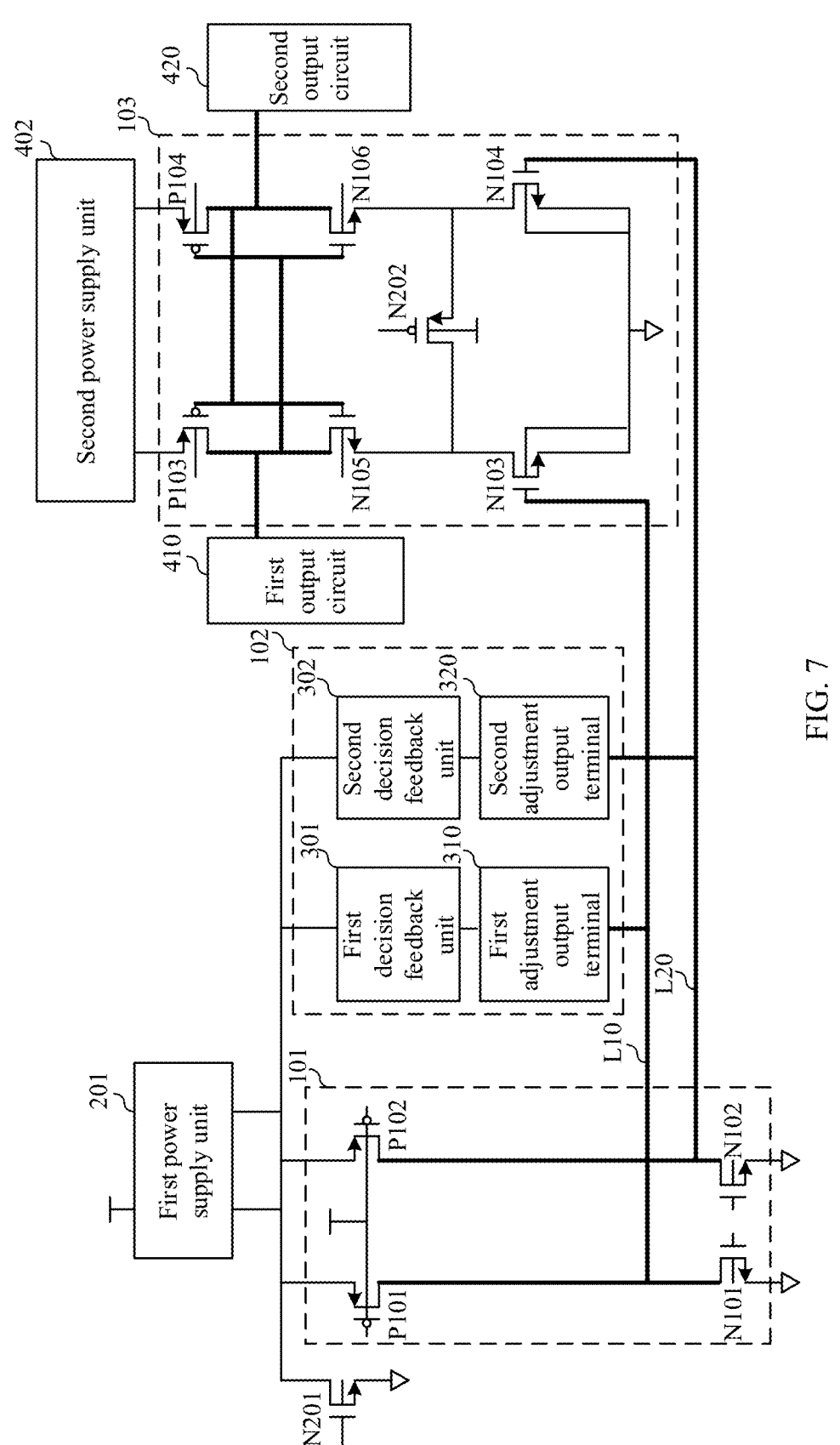
FIG. 7 is a schematic diagram of structures of a first amplification circuit, a decision equalizer, and a second amplification circuit according to an embodiment of the present disclosure.
Figure 8:
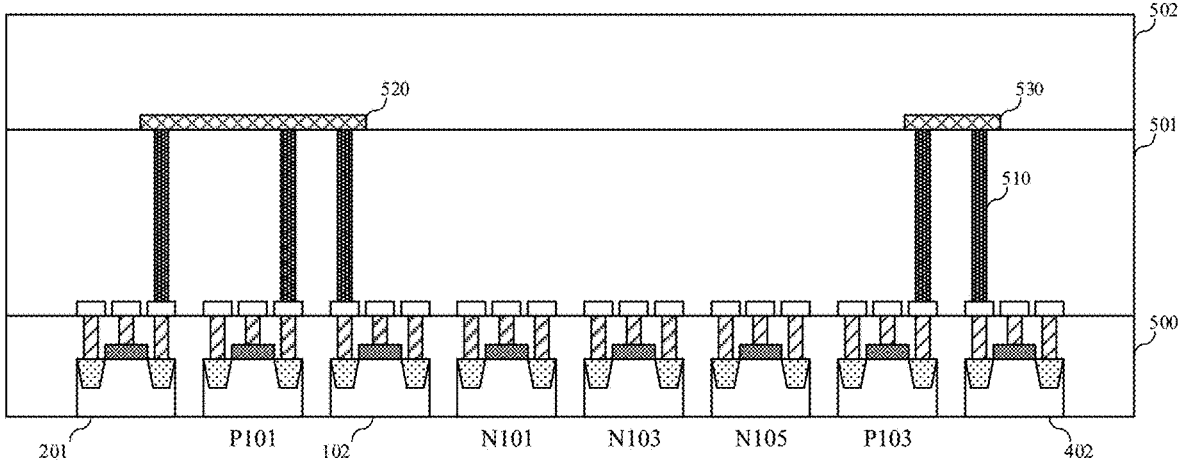
FIG. 8 is a schematic diagram of a cross-sectional structure of a data buffer circuit structure according to an embodiment of the present disclosure.

FIG. 1 is a schematic diagram of a structure of the data buffer circuit structure according to this embodiment. FIG. 2 to FIG. 4 are schematic diagrams of a layout structure of the data buffer circuit structure according to this embodiment. FIG. 5 is a schematic diagram of a structure of a first amplification circuit according to this embodiment. FIG. 6 is a schematic diagram of structures of a first amplification circuit and a decision equalizer according to this embodiment. FIG. 7 is a schematic diagram of structures of a first amplification circuit, a decision equalizer, and a second amplification circuit according to this embodiment. FIG. 8 is a schematic diagram of a cross-sectional structure of the data buffer circuit structure according to this embodiment. The data buffer circuit structure provided in this embodiment is described below in detail with reference to the accompanying drawings. Details are as follows:

Referring to FIG. 1, the data buffer circuit structure includes:

a first amplification circuit 101, a second amplification circuit 103, a decision equalizer 102, and a power module. An output terminal of the first amplification circuit 101, an input terminal of the second amplification circuit 103, and adjustment output terminals of the decision equalizer 102 are connected through a signal line L1, and the first amplification circuit 101, the second amplification circuit 103, the decision equalizer 102, and the power module are arranged in the same direction.

The power module includes a first power supply unit 201 and a second power supply unit 402. The first power supply unit 201 is configured to supply power to the first amplification circuit 101 and the decision equalizer 102, and the second power supply unit 402 is configured to supply power to the second amplification circuit 103.

A minimum distance between the first power supply unit 201 and the first amplification circuit 101 is less than a minimum distance between the first power supply unit 201 and the second amplification circuit 103, and a minimum distance between the second power supply unit 402 and the second amplification circuit 103 is less than a minimum distance between the second power supply unit 402 and the first amplification circuit 101. Briefly, the first power supply unit 201 is disposed near the first amplification circuit 101, and the second power supply unit 402 is disposed near the second amplification circuit 103.

In this embodiment of the present disclosure, the power module is disposed as the first power supply unit 201 and the second power supply unit 402, the first power supply unit 201 is disposed near the first amplification circuit 101, and the second power supply unit 402 is disposed near the second amplification circuit 103, so that the length of a power supply line between the power module and each of the first amplification circuit 101, the second amplification circuit 103, and the decision equalizer 102 is reduced, thereby optimizing the performance of a data buffer circuit.

For the first amplification circuit 101, reference is made to FIG. 2 to FIG. 5. The first amplification circuit 101 includes a P-type transistor unit and an N-type transistor unit.

In some embodiments, referring to FIG. 2, the first power supply unit 201 is located between the P-type transistor unit and the decision equalizer 102.

In some embodiments, referring to FIG. 4, the decision equalizer 102 is located between the P-type transistor unit and the first power supply unit 201.

In some embodiments, referring to FIG. 3, the P-type transistor unit is located between the decision equalizer 102 and the first power supply unit 201, and the decision equalizer 102 is disposed between the P-type transistor unit and the N-type transistor unit, so that the first power supply unit 201 supplies power to the first amplification circuit 101 and the decision equalizer 102 through a relatively short power supply line, and an interconnection line between the first amplification circuit 101 and the decision equalizer 102 is relatively short.

Referring to FIG. 5, in some embodiments, the P-type transistor unit includes: a first P-type transistor P101, where a source terminal thereof is coupled to the first power supply unit 201; and a second P-type transistor P102, where a source terminal thereof is coupled to the first power supply unit 201. The N-type transistor unit includes: a first N-type transistor N101, where a source terminal thereof is coupled to a ground terminal, and a drain terminal thereof is coupled to a drain terminal of the first P-type transistor P101; and a second N-type transistor N102, where a source terminal thereof is coupled to the ground terminal, and a drain terminal thereof is coupled to a drain terminal of the second P-type transistor P102. In the embodiment shown in FIG. 5, the drain terminals of the first N-type transistor N101 and the second N-type transistor N102 may be further connected to a zero-potential node Vss. FIG. 5 shows an example in which the ground terminal serves as the zero-potential node Vss, and the example does not constitute a limitation on this embodiment.

In some embodiments, the first amplification circuit 101 further includes a first reset transistor N201. A first terminal of the first reset transistor N201 is coupled to the source terminals of the first P-type transistor P101 and the second P-type transistor P102, a second terminal of the first reset transistor N201 is coupled to the ground terminal, and a control terminal of the first reset transistor N201 is configured to receive a first reset signal. The first reset transistor N201 is configured to reset source potentials of the first P-type transistor P101 and the second P-type transistor P102 based on the first reset signal.

The decision equalizer 102 is configured to adjust a voltage on the signal line L1. Referring to FIG. 5 and FIG. 6, the signal line L1 includes a first sub-signal line L10 and a second sub-signal line L20. On the basis of the embodiment shown in FIG. 5, the first amplification circuit 101 includes two output terminals. To be specific, a node connecting a drain of the first P-type transistor P101 and a drain of the first N-type transistor N101 serves as an output terminal, and is connected to the first sub-signal line L10, and a node connecting a drain of the second P-type transistor P102 and a drain of the second N-type transistor N102 serves as an output terminal, and is connected to the second sub-signal line L20.

The first sub-signal line L10 and the second sub-signal line L20 are small signal lines, and are configured to transmit a data signal with relatively low power.

The adjustment output terminals of the decision equalizer 102 include a first adjustment output terminal and a second adjustment output terminal. The decision equalizer 102 includes: a first decision feedback unit 301, where an output terminal thereof serves as the first adjustment output terminal, and is coupled to the first sub-signal line L10; and a second decision feedback unit 302, where an output terminal thereof serves as the second adjustment output terminal, and is coupled to the second sub-signal line L20.

For the second amplification circuit 103, reference is made to FIG. 6 and FIG. 7. The second amplification circuit 103 includes: a third N-type transistor N103, where a source terminal thereof is coupled to the ground terminal, and a gate terminal thereof is coupled to the first sub-signal line L10; a fourth N-type transistor N104, where a source terminal thereof is coupled to the ground terminal, and a gate terminal thereof is coupled to the second sub-signal line L20; a fifth N-type transistor N105, where a source terminal thereof is coupled to a drain terminal of the third N-type transistor N103; a sixth N-type transistor N106, where a source terminal thereof is coupled to the drain terminal of the fourth N-type transistor N104; a third P-type transistor P103, where a drain terminal thereof is coupled to a drain terminal of the fifth N-type transistor N105, and a source terminal thereof is coupled to the second power supply unit 402; a fourth P-type transistor P104, where a drain terminal thereof is coupled to a drain terminal of the sixth N-type transistor N106, and a source terminal thereof is coupled to the second power supply unit 402; a first output signal line, connected to a gate terminal of the fourth P-type transistor P104, a gate terminal of the sixth N-type transistor N106, and the drain terminal of the third P-type transistor P102; and a second output signal line, connected to a gate terminal of the third P-type transistor P103, a gate terminal of the fifth N-type transistor N105, and the drain terminal of the fourth P-type transistor P104.

The first output signal line and the second output signal line are large signal lines, and are configured to transmit a data output signal with relatively high power.

In some embodiments, referring to FIG. 7, the second amplification circuit 103 further includes a first output circuit 410 and a second output circuit 420. The first output circuit 410 is coupled to the first output signal line, the second output circuit 420 is coupled to the second output signal line, and the first output circuit 410 and the second output circuit 420 are configured to output complementary data. It should be noted that the "complementary data" is two pieces of output data that are reverse-phase signals. In an example, the first output circuit 410 includes a first output transistor OUT1, the second output circuit 420 includes a second output transistor OUT2, the first output transistor OUT1 is connected to the first output signal line, and the second output transistor OUT2 is connected to the second output signal line. The first output transistor OUT1 serves as a first output terminal of the data buffer circuit, and is configured to output a data signal. The second output transistor OUT2 serves as a second output terminal of the data buffer circuit, and is configured to output a reverse-phase signal of the data signal.

For the first output circuit 410 and the second output circuit 420, reference is made to FIG. 2 to FIG. 4. The first output circuit 410 and the second output circuit 420 are adjacent to the first amplification circuit 101 and the second amplification circuit 103 in a second direction, and a clock module 404 is adjacent to the first output circuit 410 and the second output circuit 420 in a first direction. An output terminal of the clock module 404 is connected to the first output circuit 410 and the second output circuit 420. The clock module controls, based on an input clock signal, the second amplification circuit 103 to output a data signal based on the first output circuit 410 and the second output circuit 420.

Specifically, the output terminal of the clock module 404 is connected to gates of the first output transistor OUT1 and the second output transistor OUT2, and the first output transistor OUT1 and the second output transistor OUT2 are turned on based on an active level of a clock signal output by the clock module 404, to output the data signal output by the second amplification circuit 103.

In some embodiments, the second amplification circuit 103 further includes a second reset transistor N202. A first terminal of the second reset transistor N202 is coupled to the drain terminal of the third N-type transistor N103, a second terminal of the second reset transistor N202 is coupled to the drain terminal of the fourth N-type transistor N104, and a control terminal of the second reset transistor N202 is configured to receive a second reset signal. The second reset transistor N202 is configured to equalize drain potentials of the third N-type transistor N103 and the fourth N-type transistor N104 based on the second reset signal.

For the first amplification circuit 101, the decision equalizer 102, the second amplification circuit 103, and the power module provided in this embodiment, in some embodiments, reference is made to FIG. 8. The first amplification circuit 101, the decision equalizer 102, the second amplification circuit 103, the first power supply unit 201, and the second power supply unit 402 are disposed at a device layer 500. The signal line L1 is disposed at a first metal interconnect layer 501 (a connection manner of the signal line L1 is not exemplified in FIG. 8), and the first metal interconnect layer 501 covers the device layer 500. The first power supply unit 201 is connected to the first amplification circuit 101 and the decision equalizer 102 based on a first power line 520. The second power supply unit 402 is connected to the second amplification circuit 103 based on a second power line 530. The first power line and the second power line are disposed at a second metal interconnect layer 502, and the second metal interconnect layer 502 covers the first metal interconnect layer 501.

Specifically, a through-hole is provided in the first metal interconnect layer 501, and the through-hole is configured to expose the first power supply unit 201, the second power supply unit 402, a source of the first P-type transistor P101, a source of the second P-type transistor P102, and a source of the third P-type transistor P103. The through-hole is filled with a conductive material to form a conductive plug 510, so that a corresponding node is connected to the surface of the first metal interconnect layer 501 based on the conductive plug 510, and then the first power supply unit 201 and the second power supply unit 402 are connected through a power line based on the first power line 520 and the second power line 530 in the second metal interconnect layer 502, to reduce a connection line length of the power supply module, thereby optimizing the performance of the data buffer circuit.

It should be noted that the first metal interconnect layer 501 is further configured to dispose an interconnection line between devices in the first amplification circuit 101, the decision equalizer 102, the second amplification circuit 103, the first power supply unit 201, and the second power supply unit 402. Illustration of a related interconnection line is omitted to clearly reflect a manner of disposing the first power line and the second power line.

Referring to FIG. 2 and FIG. 4, in this embodiment, a schematic diagram of the layout of the data buffer circuit structure is further provided. In an example, the first power supply unit 201, the first amplification circuit 101, the decision equalizer 102, the second amplification circuit 103, and the second power supply unit 402 are disposed in the first direction; the first decision feedback unit 301 and the second decision feedback unit are symmetrically disposed in the second direction, symmetrically disposed in the second direction means that it is set in the second direction and is symmetric to a line extending in the first direction; the first P-type transistor P101 and the second P-type transistor P102 are symmetrically disposed in the second direction; the third P-type transistor P103 and the fourth P-type transistor P104 are symmetrically disposed in the second direction; the first N-type transistor N101 and the second N-type transistor N102 are symmetrically disposed in the second direction; the third N-type transistor N103 and the fourth N-type transistor N104 are symmetrically disposed in the second direction; and the fifth N-type transistor N105 and the sixth N-type transistor N106 are symmetrically disposed in the second direction. The first direction and the second direction are perpendicular to each other.

It should be noted that in the examples of FIG. 2 to FIG. 4, the first direction is a horizontal direction shown in the figures, and the second direction is a vertical direction shown in the figures.

In some embodiments, the first power supply unit 201 includes first power supply transistors, the second power supply unit 402 includes second power supply transistors, the multiple first power supply transistors are arranged in the first direction, the first power supply transistors are symmetrically disposed in the second direction based on the first direction, the multiple second power supply transistors are arranged in the first direction, and the second power supply transistors are symmetrically disposed in the second direction based on the first direction, so that device environments of transistors adjacent to the first power supply unit 201 and the second power supply unit 402 are the same.

It should be noted that in some other embodiments, assuming that each of the following pairs of transistors are symmetrically disposed along a preset straight line: the first P-type transistor P101 and the second P-type transistor P102, the first N-type transistor N101 and the second N-type transistor N102, the third N-type transistor N103 and the fourth N-type transistor N104, and the fifth N-type transistor N105 and the sixth N-type transistor N106. The first power supply transistors may be disposed in the preset straight line in the first direction, and correspondingly, the second power supply transistors may also be disposed in the preset straight line in the first direction. As such, device environments of transistors adjacent to the first power supply unit 201 and the second power supply unit 402 can also be the same.

In some embodiments, referring to FIG. 2 to FIG. 4, the first power supply transistors, the first P-type transistor P101, the first decision feedback unit, the first N-type transistor N101, the third N-type transistor N103, the fifth N-type transistor N105, the third P-type transistor P103, and the second power supply transistors are arranged in the first direction; and the first power supply transistors, the second P-type transistor P102, the second decision feedback unit, the second N-type transistor N102, the fourth N-type transistor N104, the sixth N-type transistor N106, the fourth P-type transistor P104, and the second power supply transistors are arranged in the first direction.

In addition, in some embodiments, the first power supply transistors, the first P-type transistor, the second P-type transistor, and the decision equalizer 102 are disposed in the same active region, in other words, the first power supply unit 201, the P-type transistor unit in the first amplification circuit 101, and the decision equalizer 102 are disposed in the same active region. Because the first power supply unit 201, the P-type transistor unit in the first amplification circuit 101, and the decision equalizer 102 are disposed in the same active region, a layout spacing between every two of the first power supply unit 201, the first amplification circuit 101, and the decision equalizer 102 is reduced, which equivalently means that the overall layout area of the first power supply unit 201, the first amplification circuit 101, and the decision equalizer 102 is reduced, so that connection line lengths of the decision equalizer and the power module are further reduced, thereby optimizing the performance of the data buffer circuit. Correspondingly, the second power supply transistors, the third P-type transistor, and the fourth P-type transistor are disposed in the same active region, in other words, the second power supply unit 402 and the P-type transistor unit in the second amplification circuit 103 are disposed in the same active region. Because the second power supply unit 402 and the P-type transistor unit in the second amplification circuit 103 are disposed in the same active region, a layout spacing between the second power supply unit 402 and the second amplification circuit 103 is reduced, which equivalently means that the overall layout area of the second power supply unit 402 and the second amplification circuit 103 is reduced, so that a connection line length of the power module is further reduced, thereby optimizing the performance of the data buffer circuit.

In conclusion, in this embodiment of the present disclosure, the power module is disposed as the first power supply unit 201 and the second power supply unit 402, the first power supply unit 201 is disposed near the first amplification circuit 101, and the second power supply unit 402 is disposed near the second amplification circuit 103, so that the length of a power supply line between the power module and each of the first amplification circuit 101, the second amplification circuit 103, and the decision equalizer 102 is reduced, thereby optimizing the performance of the data buffer circuit.

It should be noted that the features disclosed in the data buffer circuit structure provided in the foregoing embodiment may be randomly combined when there is no conflict, to obtain a new data buffer circuit structure embodiment.

Another embodiment of the present disclosure provides a layout structure of multiple data buffer circuits, to reduce a connection line length of a decision equalizer, thereby optimizing the performance of a data buffer circuit.

Figure 9:
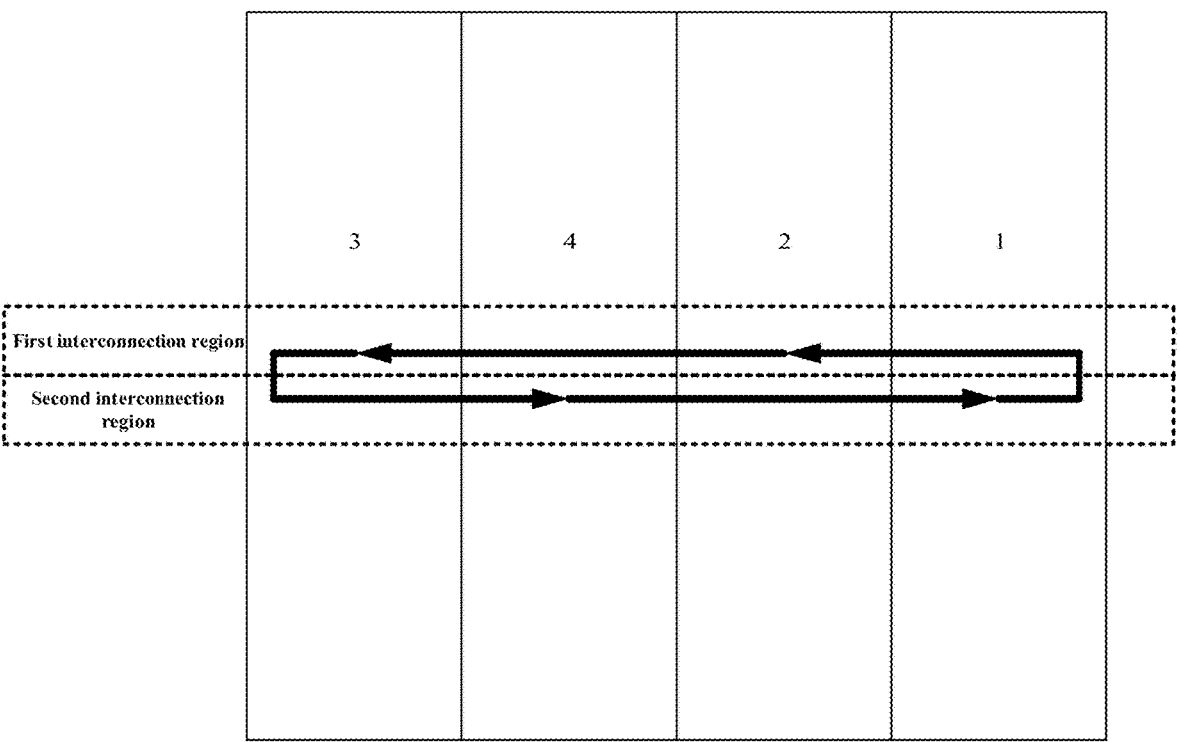
FIG. 9 is a schematic diagram of a layout of four data buffer circuits according to another embodiment of the present disclosure.
Figures 10, 11:
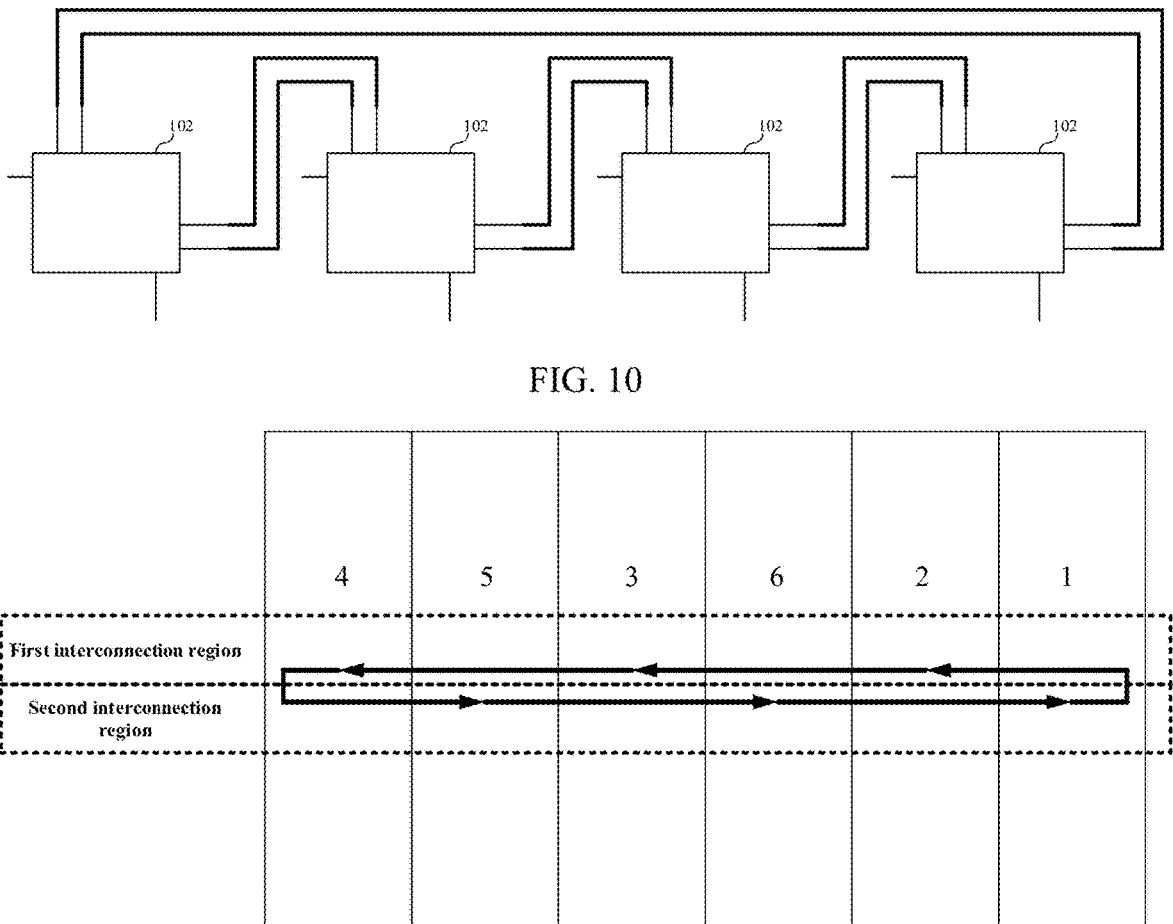
FIG. 10 is a schematic diagram of a principle of a connection relationship between multiple decision equalizers.
FIG. 11 is a schematic diagram of a layout of sixth data buffer circuits according to another embodiment of the present disclosure.

FIG. 9 is a schematic diagram of a layout of four data buffer circuits according to this embodiment. FIG. 10 is a schematic diagram of a principle of a connection relationship between multiple decision equalizers. FIG. 11 is a schematic diagram of a layout of six data buffer circuits according to this embodiment. The layout structure of multiple data buffer circuits provided in this embodiment is described below in detail with reference to the accompanying drawings. Details are as follows:

Referring to FIG. 9 and FIG. 10, the layout structure of multiple data buffer circuits includes:

multiple adjacent data buffer circuits. Each of the data buffer circuits is disposed based on the data buffer circuit structure provided in the foregoing embodiment.

In an example, decision equalizers in the data buffer circuit are cascaded with each other (reference is made to FIG. 10). An output terminal of a current-stage decision equalizer is connected to an input terminal of a next-stage decision equalizer through an interconnection line, and an output terminal of a last-stage decision equalizer is connected to an input terminal of the first-stage decision equalizer through an interconnection line. Lengths of interconnection lines between adjacent cascaded decision equalizers are the same.

It should be noted that, that the lengths of the interconnection lines between the adjacent cascaded decision equalizers are the same means that the length difference between the interconnection lines is less than 20%, which is specifically that the difference length between the interconnection lines is less than 20% of a preset length. The preset length may be set to the length of any interconnection line.

Referring to FIG. 10, in the cascaded decision equalizers, the length of the interconnection line between the last-stage decision equalizer and the first-stage decision equalizer is different from the length of an interconnection line between other decision equalizers, causing an error during data equalization feedback performed by a first-stage data buffer circuit and a last-stage data buffer circuit. Referring to FIG. 9, in this embodiment, the location disposition of different data buffer circuits is adjusted, so that the lengths of the interconnection lines between the decision equalizers in the cascaded data buffer circuits are the same, and the length of a connection line between the decision equalizers is relatively short.

Specifically, referring to FIG. 9, cascaded four-stage data buffer circuits are taken as an example. A third-stage data buffer circuit 3, a fourth-stage data buffer circuit 4, a second-stage data buffer circuit 2, and a first-stage data buffer circuit 1 are sequentially disposed. Interconnection lines between the data buffer circuits are disposed in a first interconnection region and a second interconnection region, and the first interconnection region and the second interconnection region are disposed parallel to each other. The first-stage data buffer circuit and the second-stage data buffer circuit are connected through a first interconnection line, and the first interconnection line is partially disposed in the first interconnection region and is partially disposed in the second interconnection region. The second-stage data buffer circuit and the third-stage data buffer circuit are connected through a second interconnection line, and the second interconnection line is disposed in the first interconnection region. The third-stage data buffer circuit and the fourth-stage data buffer circuit are connected through a third interconnection line, and the third interconnection line is partially disposed in the first interconnection region and is partially disposed in the second interconnection region. The fourth-stage data buffer circuit and the first-stage data buffer circuit are connected through a fourth interconnection line, and the fourth interconnection line is disposed in the second interconnection region.

In another embodiment, the locations of the first interconnection region and the second interconnection region may be interchanged based on the connection manner shown in FIG. 9, to adjust the locations of the first interconnection line, the second interconnection line, the third interconnection line, and the fourth interconnection line.

It can be learned from the connection manner in FIG. 9 that an interconnection line disposed in the same interconnection region has the length spanning two data buffer circuit floorplan regions, and an interconnection line disposed in two interconnection regions does not span a data buffer circuit floorplan region, but the interconnection line is partially bent, to achieve the consistency between the lengths of different interconnection lines.

In addition, referring to FIG. 11, cascaded six-stage data buffer circuits are taken as an example. A fourth-stage data buffer circuit 4, a fifth-stage data buffer circuit 5, a third-stage data buffer circuit 3, a sixth-stage data buffer circuit 6, a second-stage data buffer circuit 2, and a first-stage data buffer circuit 1 are sequentially disposed. Interconnection lines between the data buffer circuits are disposed in a first interconnection region and a second interconnection region, and the first interconnection region and the second interconnection region are disposed parallel to each other. The first-stage data buffer circuit and the second-stage data buffer circuit are connected through a first interconnection line, and the first interconnection line is partially disposed in the first interconnection region and is partially disposed in the second interconnection region. The second-stage data buffer circuit and the third-stage data buffer circuit are connected through a second interconnection line, and the second interconnection line is disposed in the first interconnection region. The third-stage data buffer circuit and the fourth-stage data buffer circuit are connected through a third interconnection line, and the third interconnection line is disposed in the first interconnection region. The fourth-stage data buffer circuit and the fifth-stage data buffer circuit are connected through a fourth interconnection line, and the fourth interconnection line is partially disposed in the first interconnection region and is partially disposed in the second interconnection region. The fifth-stage data buffer circuit and the sixth-stage data buffer circuit are connected through a fifth interconnection line, and the fifth interconnection line is disposed in the second interconnection region. The sixth-stage data buffer circuit and the first-stage data buffer circuit are connected through a sixth interconnection line, and the sixth interconnection line is disposed in the second interconnection region.

It should be noted that FIG. 9 and FIG. 11 respectively provide the layout of the cascaded four-stage data buffer circuits and the layout of the cascaded six-stage data buffer circuits. A person skilled in the art may derive the layout of another quantity of stages of cascaded data buffer circuits based on the examples in FIG. 9 and FIG. 11. The layout should be protected by the present disclosure, provided that a manner of disposing interconnection lines is the same as the manner of disposing the interconnection lines in FIG. 9 and FIG. 11, to be specific, an interconnection line disposed in the same interconnection region spans the length of two data buffer circuit layout regions, an interconnection line disposed in different interconnection regions spans the length of one data buffer circuit layout region, and bending is performed at the top of a part of the layout of the same interconnection region to achieve the consistency between the lengths of different interconnection lines.

In this embodiment, the location disposition of different data buffer circuits is adjusted, so that the lengths of the interconnection lines between the decision equalizers in the cascaded data buffer circuits are the same, and the length of a connection line between the decision equalizers is relatively short.

It should be noted that specific wiring of the layout is not involved in this embodiment, and therefore, a connection line of a corresponding transistor is not shown in corresponding descriptions. A person skilled in the art may perform wiring on the layout of the data buffer circuit in the accompanying drawings based on the specific circuit of the data buffer circuit in the accompanying drawings. The wiring should fall within the protection scope of the present disclosure if disposition and a power supply manner of a power module are the same as or similar to disposition and a power supply manner of the power module that are claimed by the embodiments of the present disclosure.

It should be noted that the features disclosed in the layout structure of multiple data buffer circuits provided in the foregoing embodiment may be randomly combined when there is no conflict, to obtain a new embodiment of a layout structure of multiple data buffer circuits.

Still another embodiment of the present disclosure provides a memory. A data buffer circuit in the memory is disposed based on the data buffer circuit structure provided in the foregoing embodiment, to reduce connection line lengths of a decision equalizer and the power module, thereby optimizing the performance of the data buffer circuit.

Specifically, the power module is disposed as a first power supply unit and a second power supply unit, the first power supply unit is disposed near a first amplification circuit, and the second power supply unit is disposed near a second amplification circuit, so that the length of a power supply line between the power module and each of the first amplification circuit, the second amplification circuit, and the decision equalizer is reduced, thereby optimizing the performance of the data buffer circuit.

In addition, the location disposition of different data buffer circuits is adjusted, so that the lengths of interconnection lines between decision equalizers in cascaded data buffer circuits are the same, and the length of a connection line between the decision equalizers is relatively short.

Specifically, referring to FIG. 9, cascaded four-stage data buffer circuits are taken as an example. A third-stage data buffer circuit, a fourth-stage data buffer circuit, a second-stage data buffer circuit, and a first-stage data buffer circuit are sequentially disposed. Interconnection lines between the data buffer circuits are disposed in a first interconnection region and a second interconnection region, and the first interconnection region and the second interconnection region are disposed parallel to each other. The first-stage data buffer circuit and the second-stage data buffer circuit are connected through a first interconnection line, and the first interconnection line is partially disposed in the first interconnection region and is partially disposed in the second interconnection region. The second-stage data buffer circuit and the third-stage data buffer circuit are connected through a second interconnection line, and the second interconnection line is disposed in the first interconnection region. The third-stage data buffer circuit and the fourth-stage data buffer circuit are connected through a third interconnection line, and the third interconnection line is partially disposed in the first interconnection region and is partially disposed in the second interconnection region. The fourth-stage data buffer circuit and the first-stage data buffer circuit are connected through a fourth interconnection line, and the fourth interconnection line is disposed in the second interconnection region. Referring to FIG. 11, cascaded six-stage data buffer circuits are taken as an example. A fourth-stage data buffer circuit, a fifth-stage data buffer circuit, a third-stage data buffer circuit, a sixth-stage data buffer circuit, a second-stage data buffer circuit, and a first-stage data buffer circuit are sequentially disposed. Interconnection lines between the data buffer circuits are disposed in a first interconnection region and a second interconnection region, and the first interconnection region and the second interconnection region are disposed parallel to each other. The first-stage data buffer circuit and the second-stage data buffer circuit are connected through a first interconnection line, and the first interconnection line is partially disposed in the first interconnection region and is partially disposed in the second interconnection region. The second-stage data buffer circuit and the third-stage data buffer circuit are connected through a second interconnection line, and the second interconnection line is disposed in the first interconnection region. The third-stage data buffer circuit and the fourth-stage data buffer circuit are connected through a third interconnection line, and the third interconnection line is disposed in the first interconnection region. The fourth-stage data buffer circuit and the fifth-stage data buffer circuit are connected through a fourth interconnection line, and the fourth interconnection line is partially disposed in the first interconnection region and is partially disposed in the second interconnection region. The fifth-stage data buffer circuit and the sixth-stage data buffer circuit are connected through a fifth interconnection line, and the fifth interconnection line is disposed in the second interconnection region. The sixth-stage data buffer circuit and the first-stage data buffer circuit are connected through a sixth interconnection line, and the sixth interconnection line is disposed in the second interconnection region. In other words, an interconnection line disposed in the same interconnection region spans the length of two data buffer circuit layout regions, an interconnection line disposed in different interconnection regions spans the length of one data buffer circuit layout region, and bending is performed at the top of a part of the layout of the same interconnection region to achieve the consistency between the lengths of different interconnection lines.

In some examples, the memory may be a storage cell or device based on a semiconductor device or component. For example, a memory device may be a volatile memory, e.g., a dynamic random access memory (DRAM), a synchronous dynamic random access memory (SDRAM), a double data rate synchronous dynamic random access memory (DDR SDRAM), a low power double data rate synchronous dynamic random access memory (LPDDR SDRAM), a graphics double data rate synchronous dynamic random access memory (GDDR SDRAM), a double data rate 2 synchronous dynamic random access memory (DDR2 SDRAM), a double data rate 3 synchronous dynamic random access memory (DDR3 SDRAM), a double data rate 4 synchronous dynamic random access memory (DDR4 SDRAM), or a thyristor random access memory (TRAM); or may be a non-volatile memory, e.g., a phase-change random access memory (PRAM), a magnetic random access memory (MRAM), or a resistive random access memory (RRAM).

A person of ordinary skill in the art may understand that the foregoing embodiments are specific embodiments for implementing the present disclosure. In actual application, various changes may be made to the forms and details of the embodiments without departing from the spirit and scope of the present disclosure.

What is claimed is:

1. A data buffer circuit structure, comprising:
a first amplification circuit, a second amplification circuit, a decision equalizer, and a power module, an output terminal of the first amplification circuit, an input terminal of the second amplification circuit, and adjustment output terminals of the decision equalizer being connected through a signal line, and the first amplification circuit, the second amplification circuit, the decision equalizer, and the power module being arranged in a same direction, the power module comprising a first power supply unit and a second power supply unit, the first power supply unit being configured to supply power to the first amplification circuit and the decision equalizer, and the second power supply unit being configured to supply power to the second amplification circuit; and a minimum distance between the first power supply unit and the first amplification circuit being less than a minimum distance between the first power supply unit and the second amplification circuit, and a minimum distance between the second power supply unit and the second amplification circuit being less than a minimum distance between the second power supply unit and the first amplification circuit.

2. The data buffer circuit structure according to claim 1, wherein the first amplification circuit comprises:

a P-type transistor unit and an N-type transistor unit, the first power supply unit being located between the P-type transistor unit and the decision equalizer;

the decision equalizer being located between the P-type transistor unit and the first power supply unit; or the P-type transistor unit being located between the decision equalizer and the first power supply unit.

3. The data buffer circuit structure according to claim 2, wherein the P-type transistor unit comprises:

a first P-type transistor, a source terminal thereof being coupled to the first power supply unit; and a second P-type transistor, a source terminal thereof being coupled to the first power supply unit; and, wherein the N-type transistor unit comprises:

a first N-type transistor, a source terminal thereof being coupled to a ground terminal, and a drain terminal thereof being coupled to a drain terminal of the first P-type transistor; and a second N-type transistor, a source terminal thereof being coupled to the ground terminal, and a drain terminal thereof being coupled to a drain terminal of the second P-type transistor.

4. The data buffer circuit structure according to claim 3, wherein the first amplification circuit further comprises a first reset transistor, a first terminal of the first reset transistor being coupled to the source terminals of the first P-type transistor and the second P-type transistor, a second terminal of the first reset transistor being coupled to the ground terminal, and a control terminal of the first reset transistor being configured to receive a first reset signal.

5. The data buffer circuit structure according to claim 3, wherein the adjustment output terminals comprise a first adjustment output terminal and a second adjustment output terminal, the signal line comprises a first sub-signal line and a second sub-signal line, and the decision equalizer comprises:

a first decision feedback unit, an output terminal thereof serving as the first adjustment output terminal and being coupled to the first sub-signal line; and a second decision feedback unit, an output terminal thereof serving as the second adjustment output terminal and being coupled to the second sub-signal line, the first sub-signal line being coupled to the drain terminal of the first N-type transistor; and the second sub-signal line being coupled to the drain terminal of the second N-type transistor.

6. The data buffer circuit structure according to claim 5, wherein the second amplification circuit comprises:

a third N-type transistor, a source terminal thereof being coupled to the ground terminal, and a gate terminal thereof being coupled to the first sub-signal line;

a fourth N-type transistor, a source terminal thereof being coupled to the ground terminal, and a gate terminal thereof being coupled to the second sub-signal line;

a fifth N-type transistor, a source terminal thereof being coupled to a drain terminal of the third N-type transistor;

a sixth N-type transistor, a source terminal thereof being coupled to a drain terminal of the fourth N-type transistor;

a third P-type transistor, a drain terminal thereof being coupled to a drain terminal of the fifth N-type transistor, and a source terminal thereof being coupled to the second power supply unit;

a fourth P-type transistor, a drain terminal thereof being coupled to a drain terminal of the sixth N-type transistor, and a source terminal thereof being coupled to the second power supply unit;

a first output signal line, connected to a gate terminal of the fourth P-type transistor, a gate terminal of the sixth N-type transistor, and the drain terminal of the third P-type transistor; and a second output signal line, connected to a gate terminal of the third P-type transistor, a gate terminal of the fifth N-type transistor, and the drain terminal of the fourth P-type transistor.

7. The data buffer circuit structure according to claim 6, wherein the second amplification circuit further comprises a second reset transistor, a first terminal of the second reset transistor being coupled to the drain terminal of the third N-type transistor, a second terminal of the second reset transistor being coupled to the drain terminal of the fourth N-type transistor, and a control terminal of the second reset transistor being configured to receive a second reset signal.

8. The data buffer circuit structure according to claim 6, wherein the second amplification circuit further comprises a first output circuit and a second output circuit, the first output circuit being coupled to the first output signal line, the second output circuit being coupled to the second output signal line, and the first output circuit and the second output circuit being configured to output complementary data.

9. The data buffer circuit structure according to claim 1, wherein the first amplification circuit, the decision equalizer, the second amplification circuit, the first power supply unit, and the second power supply unit are disposed at a device layer;

the signal line is disposed at a first metal interconnect layer, and the first metal interconnect layer covers the device layer;

the first power supply unit is connected to the first amplification circuit and the decision equalizer based on a first power line, and the second power supply unit is connected to the second amplification circuit based on a second power line; and the first power line and the second power line are disposed at a second metal interconnect layer, and the second metal interconnect layer covers the first metal interconnect layer.

10. The data buffer circuit structure according to claim 6, wherein the first power supply unit, the first amplification circuit, the decision equalizer, the second amplification circuit, and the second power supply unit are disposed in a first direction;

the first decision feedback unit and the second decision feedback unit are symmetrically disposed in a second direction;

the first P-type transistor and the second P-type transistor are symmetrically disposed in the second direction;

the third P-type transistor and the fourth P-type transistor are symmetrically disposed in the second direction;

the first N-type transistor and the second N-type transistor are symmetrically disposed in the second direction;

the third N-type transistor and the fourth N-type transistor are symmetrically disposed in the second direction; and the fifth N-type transistor and the sixth N-type transistor are symmetrically disposed in the second direction, the first direction and the second direction being perpendicular to each other.

11. The data buffer circuit structure according to claim 10, wherein the first power supply unit comprises first power supply transistors, and the second power supply unit comprises second power supply transistors;

a plurality of first power supply transistors are arranged in the first direction, and are symmetrically disposed in the second direction based on the first direction; and a plurality of second power supply transistors are arranged in the first direction, and are symmetrically disposed in the second direction based on the first direction.

12. The data buffer circuit structure according to claim 11, wherein the first power supply transistors, the first P-type transistor, the first decision feedback unit, the first N-type transistor, the third N-type transistor, the fifth N-type transistor, the third P-type transistor, and the second power supply transistors are arranged in the first direction; and the first power supply transistors, the second P-type transistor, the second decision feedback unit, the second N-type transistor, the fourth N-type transistor, the sixth N-type transistor, the fourth P-type transistor, and the second power supply transistors are arranged in the first direction.

13. The data buffer circuit structure according to claim 12, wherein the first power supply transistors, the first P-type transistor, the second P-type transistor, and the decision equalizer are disposed in a same active region; and the second power supply transistors, the third P-type transistor, and the fourth P-type transistor are disposed in a same active region.

14. A layout structure of a plurality of data buffer circuits, comprising a plurality of adjacent data buffer circuits, each of the data buffer circuits being disposed based on the data buffer circuit structure according to claim 1.

15. The layout structure of a plurality of data buffer circuits according to claim 14, wherein decision equalizers in the data buffer circuit are cascaded with each other, an output terminal of a current-stage decision equalizer being connected to an input terminal of a next-stage decision equalizer through an interconnection line, and an output terminal of a last-stage decision equalizer being connected to an input terminal of a first-stage decision equalizer through an interconnection line, lengths of interconnection lines between adjacent cascaded decision equalizers being the same.

16. The layout structure of a plurality of data buffer circuits according to claim 15, comprising a third-stage data buffer circuit, a fourth-stage data buffer circuit, a second-stage data buffer circuit, and a first-stage data buffer circuit that are adjacent to each other, the interconnection lines being disposed in a first interconnection region and a second interconnection region, and the first interconnection region and the second interconnection region being disposed parallel to each other, the first-stage data buffer circuit and the second-stage data buffer circuit being connected through a first interconnection line, and the first interconnection line being partially disposed in the first interconnection region and being partially disposed in the second interconnection region;

the second-stage data buffer circuit and the third-stage data buffer circuit being connected through a second interconnection line, and the second interconnection line being disposed in the first interconnection region;

the third-stage data buffer circuit and the fourth-stage data buffer circuit being connected through a third interconnection line, and the third interconnection line being partially disposed in the first interconnection region and being partially disposed in the second interconnection region; and the fourth-stage data buffer circuit and the first-stage data buffer circuit being connected through a fourth interconnection line, and the fourth interconnection line being disposed in the second interconnection region.

17. A memory, a data buffer circuit in the memory being disposed based on the data buffer circuit structure according to claim 1.

* * * * *